United States Patent [19]

Law et al.

[11] Patent Number: 5,441,768

[45] Date of Patent: Aug. 15, 1995

[54] MULTI-STEP CHEMICAL VAPOR DEPOSITION METHOD FOR THIN FILM TRANSISTORS

[75] Inventors: Kam S. Law, Union City; Robert Robertson, Palo Alto; Michael Kollrack, Alameda; Angela T. Lee, Sunnyvale; Takako Takehara, Hayward; Guofu J. Feng, San Jose; Dan Maydan, Los Altos Hills, all of Calif.

[73] Assignee: Applied Materials, Inc., Santa Clara, Calif.

[21] Appl. No.: 193,310

[22] Filed: Feb. 8, 1994

[51] Int. Cl.$^6$ .................................. C23C 16/22
[52] U.S. Cl. .................. 427/255.7; 427/248.1; 427/255; 427/578; 427/579; 427/402; 437/101; 437/909
[58] Field of Search .............. 427/248.1, 255.7, 255, 427/402, 578, 579; 437/101, 909

[56] References Cited

U.S. PATENT DOCUMENTS 5,273,920 12/1993 Kwasnick et al. ............. 437/40

Primary Examiner—Roy V. King
Attorney, Agent, or Firm—Randy W. Tung

[57] ABSTRACT

An improved method of depositing films of a gate silicon nitride and an amorphous silicon on a thin film transistor substrate at high deposition rates while maintaining superior film quality is provided. The material near the interface between the amorphous silicon and the nitride are deposited at a low deposition rate which produces superior quality films. The region away from the interface are deposited at a high deposition rate which produces lesser, but still good quality films. By using this method, superior quality thin film transistors can be produced at very high efficiency. The method can be carried out by depositing a high quality g-SiN$_x$ at a low deposition rate on top of an average quality gate nitride deposited at a high deposition rate and then depositing an amorphous silicon layer. It also applies in a process where high quality amorphous silicon is first deposited at a low deposition rate on a gate nitride layer to form an interface, and then average quality amorphous silicon is deposited at a high deposition rate to complete the silicon layer. The unique process can be applied whenever an interface exists with an active semiconductor layer of amorphous silicon. The process is applicable to either the back channel etched TFT device or the etch stopped TFT device.

17 Claims, 2 Drawing Sheets

MULTI-STEP CHEMICAL VAPOR DEPOSITION METHOD FOR THIN FILM TRANSISTORS

FIELD OF THE INVENTION

The present invention generally relates to a method of sequentially depositing multiple layers of electronic materials including amorphous silicon and silicon nitride on a substrate in a chemical vapor deposition process and more particularly, relates to a method of sequentially depositing multiple layers of electronic materials including amorphous silicon and silicon nitride on a substrate by a two-stage high deposition rate/low deposition rate process during which the layer adjacent to the interface with a different material is deposited at the low deposition rate.

BACKGROUND OF THE INVENTION

A plasma-enhanced chemical vapor deposition (PECVD) process is a process widely used in the manufacture of semiconductor devices for depositing layers of electronic materials on various substrates. In a PECVD process, a substrate is placed in a vacuum deposition chamber equipped with a pair of parallel plate electrodes or other means of coupling electrical energy into the chamber, such as a helical coil. The substrate is generally mounted on a susceptor which is also the lower electrode. A flow of a reactant gas is provided in the deposition chamber through a gas inlet manifold which also serves as the upper electrode. A radio frequency (RF) voltage is applied between the two electrodes which generates an RF power sufficient to cause the reactant gas to form a plasma. The plasma causes the reactant gas to vigorously react and deposit a layer of the desired material on the surface of the substrate body. Additional layers of other electronic materials can be deposited on the first layer by providing in the deposition chamber a flow of a reactant gas containing the material of the additional layer to be deposited. Each reactant gas is subjected to a plasma which results in the deposition of a layer of the desired material.

In recent years, large liquid crystal cells have been used for flat panel displays. These type of liquid crystal cells contain two glass plates joined together with a layer of a liquid crystal material sandwiched therein. The glass substrates have conductive films coated thereon with at least one of the substrates being transparent. The substrates can be connected to a power source to change the orientation of the liquid crystal material such that various areas of the liquid crystal cell can be accessed by proper patterning of the conductive films. More recently, thin film transistors (TFT) have been used to separately address areas of the liquid crystal cell at very fast rates. This type of liquid crystal cells are useful for active matrix displays such as TV and computer monitors.

As the requirements for resolution of liquid crystal monitors increase, it becomes desirable to separately address a plurality of areas of the liquid crystal cell, called pixels. In a modern display panel, more than 1,000,000 pixels are normally present and the same number of transistors must be formed on the glass plates such that each pixel can be separately addressed and latched into one of two stable states.

Two major types of thin film transistor devices that are in commercial usage are the back channel etched (BCE) thin film transistor and the etch stopped (E/S) thin film transistor. The efficiency of manufacturing such amorphous silicon-based thin film transistors has been limited by the PECVD process utilized. It is difficult to produce good quality gate silicon nitride (g-$SiN_x$) and amorphous silicon (a-Si) films at high deposition rates to achieve manufacturing efficiency and high throughput. The term $SiN_x$ is used to represent all silicon nitrides that may or may not have the exact stoichiometric ratio of Si:N at 3:4, i.e., $Si_3N_4$. For instance, $SiN_x$ includes all silicon nitrides that have an atomic ratio of Si:N that is higher or lower than 3:4. The term amorphous silicon indicates a silicon that has a completely amorphous structure without any crystallinity.

In a typical BCE TFT device, the deposition of thick films of g-$SiN_x$ and a-Si is necessary. The film thickness required is normally in the range between 250 to 500 nm. In order to produce good quality films, a typical deposition rate used in the industry is approximately 20 nm/min. At such a low deposition rate, the substrate manufacturing process is very inefficient. However, when a fast deposition rate such as 300 nm/min is used, films of unacceptable quality are produced.

It is therefore an object of the present invention to provide a method of depositing multiple layers of thick films of g-$SiN_x$ and a-Si on a thin film transistor substrate at high deposition rates such that it can be suitably used in a manufacturing process.

It is another object of the present invention to provide a method of depositing thick films of g-$SiN_x$ and a-Si on a thin film transistor substrate at high deposition rates while producing films of superior quality suitable for use in a manufacturing process.

SUMMARY OF THE INVENTION

The present invention provides a method of depositing layers of silicon nitride and amorphous silicon films on a thin film substrate at a satisfactory deposition rate while maintaining superior film quality.

In a preferred embodiment useful for thin-film transistors, the layer of material near the interface of the amorphous silicon is deposited at a low deposition rate which produces superior quality films. The layer of material away from the interface is deposited at a high deposition rate which produces lesser, but still good quality films. By using the present invention, thin film transistors of overall superior quality can be produced at very high efficiency.

The present invention can be carried out by depositing a high quality g-$SiN_x$ film at a low deposition rate on top of an average quality g-$SiN_x$ film deposited at a high deposition rate, prior to the deposition of an a-Si layer on top of the total g-$SiN_x$ layers. It can also be applied in a process where a high quality a-Si is first deposited at a low deposition rate on a g-$SiN_x$ layer forming an interface, and then an average quality a-Si is deposited at a high deposition rate to complete the a-Si layer. The unique process can be applied whenever there is an interface with an active semiconductor layer of amorphous silicon. It is applicable to either the BCE TFT device or the ES TFT device.

DETAILED DESCRIPTION OF THE PREFERRED EMBODIMENT

The present invention discloses an improved method of depositing multi-layers of thick silicon nitride and amorphous silicon films on a substrate at a satisfactory deposition rate while producing superior quality films. The invention is particularly useful with combinations of a-Si films and g-SiN$_x$ films forming a thin film transistor (TFT).

Figure 1:
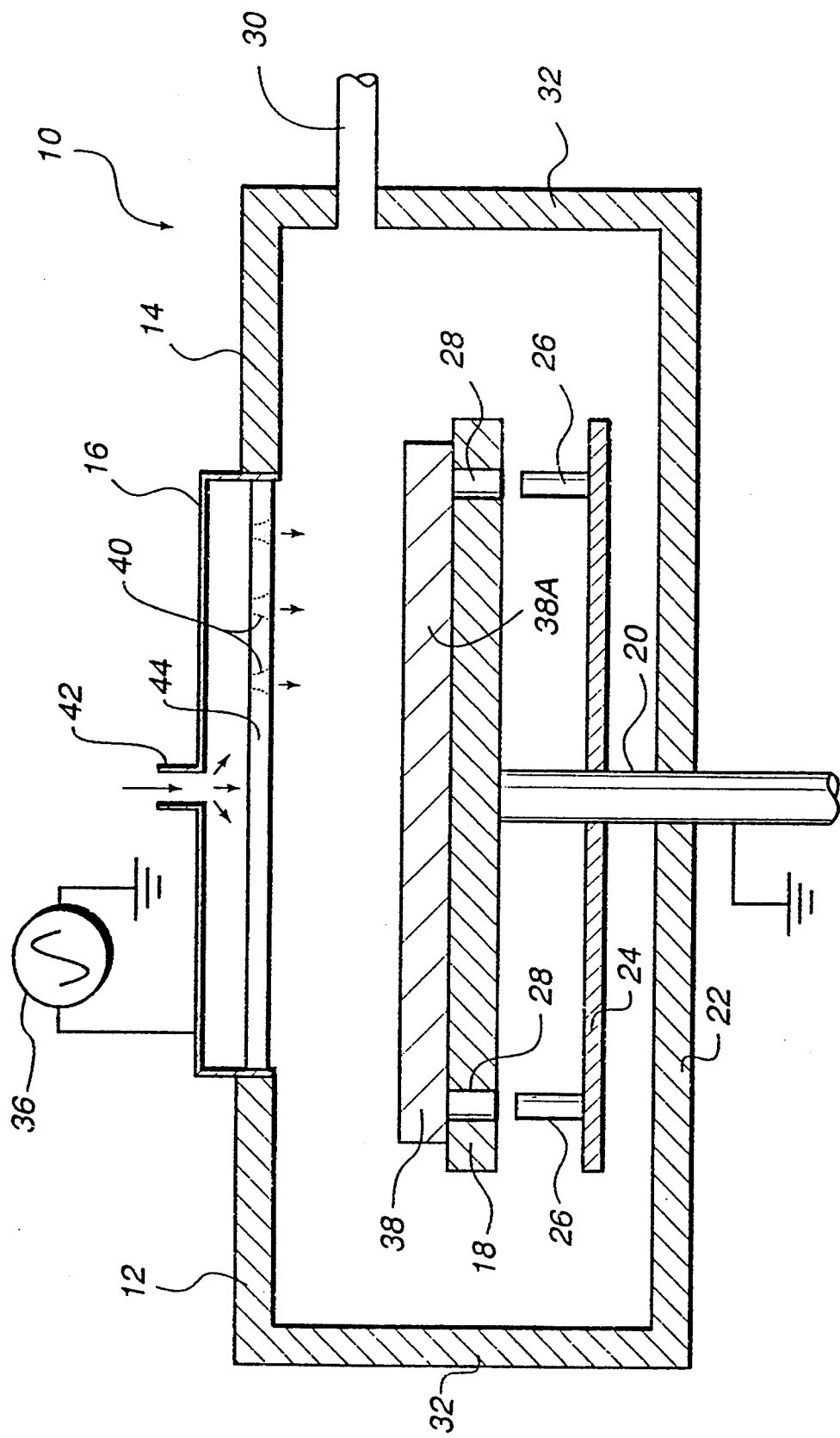
FIG. 1 is a schematic sectional view of a plasma-enhanced chemical vapor deposition chamber in which the method in accordance with the present invention can be carried out.

Referring initially to FIG. 1, there is shown a schematic sectional view of a plasma-enhanced chemical vapor deposition apparatus 10 in which a method in accordance with the present invention can be carried out. Apparatus 10 comprises a deposition chamber 12 which has across a top wall 14 an opening therethrough and a first electrode or a gas inlet manifold 16 within the opening. Alternatively, the top wall 14 can be solid with the electrode 16 being adjacent to the inner surface thereof. Within chamber 12 is a susceptor 18 in the form of a plate which extends parallel to the first electrode 16. The susceptor 18 is typically of aluminum and is coated with a layer of aluminum oxide. The susceptor 18 is connected to ground so that it serves as a second electrode. The susceptor 18 is mounted on the end of a shaft 20 which extends vertically through a bottom wall 22 of the deposition chamber 12. The shaft 20 is movable vertically so as to permit the movement of the susceptor 18 vertically toward and away from the first electrode 16. A lift-off plate 24 extends horizontally between the susceptor 18 and the bottom wall 22 of the deposition chamber 12 substantially parallel to the susceptor 18. Lift-off pins 26 project vertically upwardly from the lift-off plate 24. The lift-off pins 26 are positioned to be able to extend through holes 28 in the susceptor 18, and are of a length slightly longer than the thickness of the susceptor 18. While there are only two lift-off pins 26 shown in the figure, there may be more of the lift-off pins 26 spaced around the lift-off plate 24. A gas outlet 30 extends through a side wall 32 of the deposition chamber 12 and is connected to means (not shown) for evacuating the deposition chamber 12. A gas inlet pipe 42 extends through the first electrode or the gas inlet manifold 16 of the deposition chamber 12, and is connected through a gas switching network (not shown) to sources (not shown) of various gases. The first electrode 16 is connected to an RF power source 36. A transfer plate (not shown) is typically provided to carry substrates through a load-lock door (not shown) into the deposition chamber 12 and onto the susceptor 18, and also to remove the coated substrate from the deposition chamber 12. Turner et al. disclose such an apparatus in U.S. patent application Ser. No. 08/010,683, filed Jan. 28, 1993 and assigned to the common assignee.

In the operation of the deposition apparatus 10, a substrate 38 is first loaded into the deposition chamber 12 and is placed on the susceptor 18 by the transfer plate (not shown). The substrate 38 is of a size to extend over the holes 28 in the susceptor 18. A commonly used size for a glass thin film transistor substrate is approximately 360 mm by 465 mm. The susceptor 18 lifts the substrate 38 off the lift-off pins 26 by moving shaft 20 upwards such that the lift-off pins 26 do not extend through the holes 28, and the susceptor 18 and substrate 38 are relatively close to the first electrode 16. The electrode spacing or the distance between the substrate surface and the discharge surface of the gas inlet manifold 16 is between about 0.5 to about 2 in. A more preferred electrode spacing is between about 0.8 to about 1.4 in.

At the start of the deposition process, the deposition chamber 12 is first evacuated through the gas outlet 30. Inside deposition chamber 12, a TFT glass substrate 38 which has already been formed with processed layer on top (such as patterned metal of aluminum), is positioned on the susceptor 18.

Different types of thin film transistors are in current use. Most of these transistors require deposition of a gate dielectric layer over a patterned gate metal on a TFT substrate with an amorphous silicon layer subsequently deposited on top of the gate dielectric layer. Metal contacts are deposited thereafter over the amorphous silicon film, which may also have a thin layer of doped amorphous silicon deposited thereover to improve contact between the amorphous silicon and the overlying metal. A nitride layer may also be deposited over the amorphous silicon layer as an etch stop.

Gate dielectric layers of silicon nitride must be of high quality in order to be useful as an insulating layer in the manufacturing of thin film transistors on glass substrates. In the described embodiments of the present invention, high quality silicon nitride films are achieved by depositing the nitride while maintaining the pressure in the CVD chamber at between about 1.2 to about 1.5 torr, and the substrate temperature at about 300° to 350° C. Reactant gas flow rates are regulated to maintain adequate reactant gas levels. Suitably, silane at between 100 and 300 sccm and ammonia at between 500 and 1,000 sccm are employed in a carrier gas of nitrogen at between 1,000 and 10,000 sccm to deposit silicon nitride films on the substrates of the described area and with the described spacing between the showerhead and substrate. A suitable thickness of the gate silicon nitride film is between about 200 and 1,000 nm.

The normal processing conditions for the deposition of g-SiN$_x$ and a-Si films are shown below in Tables 1 and 2.

TABLE 1

| g-SiN$_x$ Processes | High Quality Film | Average Quality Film |
| --- | --- | --- |
| SiH$_4$ flow rate, sccm | 110 | 170 |
| NH$_3$ flow rate, sccm | 550 | 1000 |
| N$_2$ flow rate, sccm | 3900 | 2200 |
| RF power, watts | 600 | 1200 |
| Pressure, torr | 1.2 | 1.5 |
| Electrode Spacing, mils | 1000 | 1000 |
| Substrate Temp., °C. | 330 | 330 |
| Deposition Rate, nm/min | 100 | 270 |
| Film Thickness, nm | 50 | 300 |
| Effective Dep. Rate, nm/min | 217 | 217 |
| Typical Prior Art Dep. Rate, nm/min | 20 | 20 |
| Refractive Index | 1.9 | 1.84 |
| Stress, $\times 10^9$ dyne/cm$^2$ | −5.3 | 5.2 |
| Wet Etch Rate, nm/min | 40 | 240 |
| FTIR N—H bonds, atomic % | 25.7 | 26.3 |
| FTIR Si—H bonds, atomic % | 5.9 | 9.8 |

TABLE 2

| a-Si Processes | High Quality Film | Average Quality Film |
| --- | --- | --- |
| SiH$_4$ flow rate, sccm | 265 | 1000 |
| H$_2$ flow rate, sccm | 1450 | 1500 |
| RF power, watts | 150 | 1000 |
| Pressure, torr | 1.2 | 1.2 |
| Electrode Spacing, mils | 1000 | 1000 |
| Substrate Temp., °C. | 310 | 310 |
| Deposition Rate, nm/min | 58 | 290 |
| Film Thickness, nm | 20 | 250 |
| Effective Dep. Rate, nm/min | 224 | 224 |
| Typical Prior Art Dep. Rate, nm/min | 80 | 80 |
| Stress, $\times 10^9$ dyne/cm$^2$ | −8 | −8 |
| FTIR Si—Hx position, cm$^{-1}$ | 1996 | 1999 |
| FTIR Si—Hx width, cm$^{-1}$ | 95 | 97 |

Typical deposition processes and their processing conditions are illustrated in the following examples.

EXAMPLE 1

Figure 2:
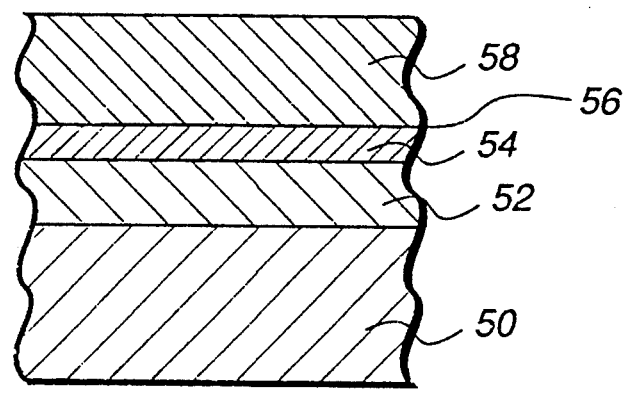
FIG. 2 is an enlarged sectional view of a BCE or ES multi-step g-SiN$_x$ TFT device.

FIG. 2 shows an enlarged cross-sectional view of a BCE or ES multi-step g-SiN$_x$ TFT device. In an initial process not directly related to the invention, a TFT substrate 50 of glass is coated with patterned metal (not shown) such as aluminum. The substrate 50 is then first deposited with a layer 52 of average quality g-SiN$_x$ at a high deposition rate of 270 nm/min. A high quality g-SiN$_x$ film 54 is then deposited at a low deposition rate of 100 nm/min on top of the average quality g-SiN$_x$ film 52 to complete the g-SiN$_x$ deposition process. This high quality gate silicon nitride layer provides an excellent interface 56 with an a-Si layer 58 subsequently deposited at a deposition rate of 58 nm/min.

EXAMPLE 2

Figure 3:
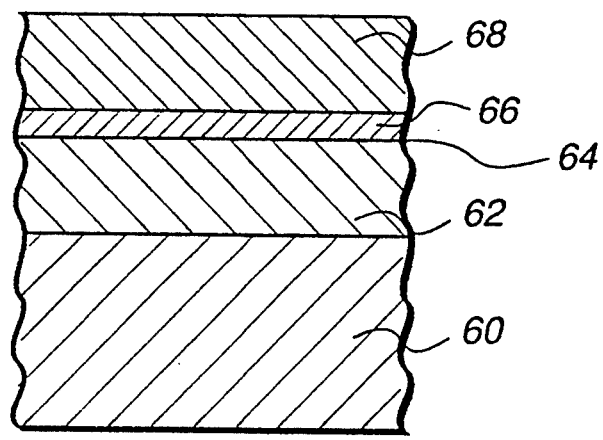
FIG. 3 is an enlarged sectional view of a BCE multi-step a-Si TFT device.

FIG. 3 shows an enlarged cross-sectional view of a BCE multi-step a-Si TFT device. A glass TFT substrate 60 is pre-coated with patterned metal (not shown) such as aluminum. It is then deposited at a deposition rate of 100 nm/min with a layer 62 of gate silicon nitride as an insulator layer. An excellent interface 64 is obtained by the subsequent deposition of a high quality a-Si layer 66 at a low deposition rate of 58 nm/min. An average quality a-Si layer 68 is then deposited at a high deposition rate of 290 nm/min. to complete the deposition process for a-Si.

EXAMPLE 3

Figure 4:
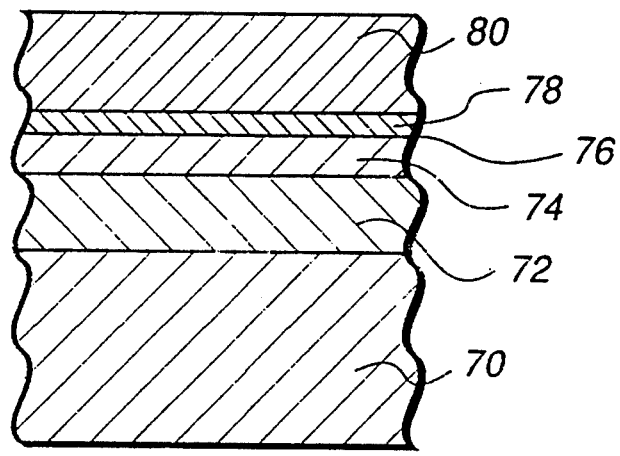
FIG. 4 is an enlarged sectional view of a BCE multi-step g-SiN$_x$ and a-Si TFT device.

FIG. 4 shows an enlarged cross-sectional view of a back channel etched TFT device incorporating a multi-step g-SiN$_x$ layer and an a-Si layer. A glass TFT substrate 70 is pre-coated with patterned metal (not shown) such as aluminum. It is then first deposited with a layer of average quality g-SiN$_x$ film 72 at a high deposition rate of 270 nm/min. A high quality g-SiN$_x$ film 74 is then deposited at a low deposition rate of 100 nm/min to provide an excellent interface 76 with an overlying high quality a-Si layer 78 subsequently deposited at a low deposition rate of 58 nm/min. A lower quality a-Si layer 80 is then deposited on top of layer 78 at a high deposition rate of 290 nm/min to complete the deposition process.

The present invention provides an improved method of producing superior quality films at high deposition rates, i.e. up to 300 nm/min for both g-SiN$_x$ and a-Si. When used in a multi-step PECVD process, high quality TFT devices can be produced at high efficiency. Another advantage of this improved method is that it enables the deposition of both g-SiN$_x$ and a-Si films in a single process chamber.

While the present invention has been described in an illustrate manner, it should be understood that the terminology used is intended to be in a nature of words of description rather than of limitation.

Furthermore, while the present invention has been described in terms of several preferred embodiments thereof, it is to be appreciated that those skilled in the art will readily apply these teachings to other possible variations of the invention. For instance, the teachings can be applied to any other combinations or configurations of g-SiN$_x$, a-Si and E/S SiN$_x$ (etch stopped silicon nitride) films deposited on a TFT substrate to improve the quality of the interfaces between the films.

An example of an E/S SiN$_x$ film structure is a substrate patterned with aluminum or other conductor, over which is deposited a lower, insulating layer of SiN$_x$, an active amorphous Si layer, and an upper, etch-stop layer of SiN$_x$. According to the invention one or both of the SiN$_x$ layers are divided into two parts, a thin, high-quality, slowly deposited layer adjacent to the active amorphous Si layer, and a thicker, lower-quality, more quickly deposited layer adjacent to the thin layer and away from the amorphous Si layer. The divided growth procedure provides a high-quality junction between the SiN$_x$ and the amorphous silicon without unduly increasing the deposition time.

The embodiments of the invention in which an exclusive property or privilege is claimed are defined as follows:

1. A method of depositing at least two layers of electronic materials on a substrate such that an interface between a layer of amorphous silicon and a layer of silicon nitride is formed therein comprising the step of forming at least one of the said two layers by a two-stage deposition process comprising a first chemical vapor deposition process conducted at a first deposition rate for at least one of said two layers is carried out forming said interface followed by a second chemical vapor deposition process conducted at a second deposition rate and is lower than said first deposition rate for forming said interface with a subsequently deposited different material, each of said first and second depositing rates being selected from the respective ranges of between 20 and 300 nm/min.

2. A method according to claim 1, wherein said second deposition process produces a film that is contiguous to the film produced in said first deposition process.

3. A method according to claim 1, wherein said first deposition rate is not lower than 150 nm/min and said second deposition rate is not higher than 100 nm/min.

4. A method according to claim 1, wherein said first deposition process produces a film having a thickness of not lower than 200 nm and said second deposition process produces a film having a thickness of not higher than 200 nm and is contiguous to the film produced in said first deposition process.

5. A method according to claim 1, wherein the difference between said first deposition rate and said second deposition rate is at least 50 nm/min.

6. A method according to claim 1, wherein said first layer deposited is silicon nitride and said second layer deposited is amorphous silicon.

7. A method according to claim 1, wherein said range of said first deposition rate is greater than or equal to 50 nm/min.

8. A method according to claim 1, wherein said subsequently deposited different material being deposited by a third deposition process comprising a third deposition rate followed by a fourth deposition comprising a fourth deposition rate higher than said third deposition rate, each of said third and fourth deposition rates being selected from the respective ranges of between 20 and 300 nm/min.

9. A method of depositing layers of electronic materials on a substrate including at least one layer of amorphous silicon and one layer of silicon nitride having at least one interface therein between comprising the steps of forming at least one of said layers of said materials by a two-stage chemical vapor deposition process wherein a first deposition rate is utilized to build said at least one of the two layers to a first thickness at said at least one interface and then a second deposition rate is utilized to build said layer to a second thickness, wherein said second deposition rate is different than said first deposition rate by a difference between about 50 nm/min and about 250 nm/min.

10. A method according to claim 9, wherein said substrate is a back channel etched thin film transistor or an etch stopped thin film transistor.

11. A method according to claim 9, wherein the difference between said first deposition rate and said second deposition rate is larger than 100 nm/min.

12. A method according to claim 9, wherein said at least one interface is an amorphous silicon/gate silicon nitride interface.

13. A method of depositing multiple layers of electronic materials on a thin film transistor substrate including at least one layer of amorphous silicon and one layer of silicon nitride with at least one interface therein between comprising the steps of depositing one of said at least one layer by a two-stage chemical vapor deposition process wherein a low deposition rate of between about 50 nm/min and about 100 nm/min is first used to deposit said material forming said at least one interface juxtaposed to a material different than said material being deposited, followed by a high deposition rate of between about 150 nm/min and about 300 nm/min to deposit said material to a desired thickness.

14. A method according to claim 13, wherein the thickness of said material being deposited by said low deposition rate is not larger than 100 nm and the thickness of said material being deposited by said high deposition rate is not smaller than 150 nm.

15. A method according to claim 13, wherein a high deposition rate of larger than 150 nm/min is first used to deposit said material forming said at least one interface juxtaposed to a different material, followed by a low deposition rate of smaller than 100 nm/min to deposit said material to a desired thickness.

16. A method of depositing at least two layers of electronic material on a substrate such that a first interface between a layer of amorphous silicon and a layer of silicon nitride is formed therein comprising the step of forming at least one of said two layers by a two-stage deposition process comprising a first chemical vapor deposition process conducted at a first deposition rate followed by a second chemical vapor deposition process conducted at a second deposition rate higher than said first deposition rate for forming said first interface with a previously deposited different material, each of said first and second deposition rates being selected from the respective ranges of between 20 and 300 nm/min.

17. A method according to claim 16, wherein said first layer deposited is silicon nitride and said second layer deposited is amorphous silicon.

* * * * *